(12) United States Patent
Havens

(10) Patent No.: US 6,965,236 B2
(45) Date of Patent: Nov. 15, 2005

(54) MRI SYSTEM UTILIZING SUPPLEMENTAL STATIC FIELD-SHAPING COILS

(75) Inventor: Timothy J. Havens, Florence, SC (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 19 days.

(21) Appl. No.: 10/707,090

(22) Filed: Nov. 20, 2003

(65) Prior Publication Data

US 2005/0110491 A1    May 26, 2005

(51) Int. Cl.$^7$ ................................................ G01V 3/00
(52) U.S. Cl. ....................... 324/319; 324/320
(58) Field of Search ............................ 324/319, 320, 324/318, 322, 300; 335/216

(56) References Cited

U.S. PATENT DOCUMENTS

| | | | |
|---|---|---|---|
| 5,225,782 A | | 7/1993 | Laskaris et al. |
| 5,428,292 A | * | 6/1995 | Dorri et al. ............... 324/319 |
| 5,545,997 A | * | 8/1996 | Westphal et al. .......... 324/320 |
| 5,568,110 A | * | 10/1996 | Dorri et al. ............... 335/216 |
| 5,596,303 A | * | 1/1997 | Akgun et al. .............. 335/216 |
| 6,456,076 B1 | * | 9/2002 | Joseph ....................... 324/318 |

* cited by examiner

*Primary Examiner*—Louis Arana
(74) *Attorney, Agent, or Firm*—Michael Della Penna

(57) ABSTRACT

A magnetic resonance imaging system (10) includes a superconducting magnet (14) that generates a static magnetic field. A gradient coil assembly (50) with an associated patient bore enclosure (18) and a gradient coil (52) that generates a gradient magnetic field in the patient bore (18). A static field-shaping coil (11) resides between the superconducting magnet (14) and the patient bore (18) and supplements the static magnetic field.

27 Claims, 4 Drawing Sheets

MRI SYSTEM UTILIZING SUPPLEMENTAL STATIC FIELD-SHAPING COILS

BACKGROUND OF INVENTION

The present invention relates generally to Magnetic Resonance Imaging (MRI) systems, and more particularly, to a system for generating a highly uniform static magnetic field.

Magnetic Resonance Imaging (MRI) systems are generally in either a cylindrical or an open architecture configuration. Both the cylindrical and open architecture configurations include a superconducting magnet that generates a temporally constant primary magnetic field. The superconducting magnet resides within a cryostat, which cools the superconducting magnet and maintains the operating temperature thereof. The temperature of the superconductor is maintained at approximately 4–10° K., for low temperature superconductors, and at approximately 20–80° K. for high temperature superconductors. The cryostat is typically contained within several thermal shields.

The superconducting magnet is used in conjunction with a first set of magnetic gradient coils, which are sequentially pulsed to create a sequence of controlled gradients in the main magnetic field during a MRI data gathering sequence. The superconducting magnet and the magnetic gradient coil assembly have a radio frequency (RF) coil on an inner circumferential side of the magnetic gradient coil assembly. The controlled sequential gradients are effectuated throughout a patient imaging volume of a patient bore, which is coupled to one or more RF coils or antennae and an RF shield. The RF coils and the RF shield are typically located between the magnetic gradient coil assembly and the patient bore.

As a part of a typical MRI, RF signals of suitable frequencies are transmitted into the patient bore. Nuclear magnetic resonance (nMR) responsive RF signals are then received from the patient via the RF coils. Information encoded within the frequency and phase parameters of the received RF signals, by the use of a RF circuit, is processed to form visual images. These visual images represent the distribution of nMR nuclei within a cross-section or volume of the patient.

When the gradient coils are electrically pulsed, the resulting time changing magnetic flux in any of the electrically conducting cylinders surrounding the gradient coils induces eddy currents. These eddy currents in turn produce their own magnetic fields, which degrade the quality of the desired gradient field in space and time. A second set of gradient coils, sometimes referred to as gradient shield coils, are typically incorporated between the cryostat and the first set of gradient coils to compensate for the aggressive pulse sequences which are routinely used in MRI imaging. The gradient shield coils reduce the amount of mutual inductance between the conducting members, such as the thermal shields, and the first set of gradient coils, which in turn reduces the amount of generated eddy currents.

Also, MR imaging requires a highly uniform magnetic field to generate good quality images. To increase imaging quality it is desirable to increase field strength of the magnet field. By increasing magnetic field strength, the stray MR field increases. Thus, a field strength limitation arises when maintaining the stray MR field below a specified level to minimize or prevent individuals outside of the MRI room from being effected by the field. In order to minimize the field, the MRI room may be shielded from the surrounding environment, however the shielding can be costly and impractical.

For example, a typical 0.5 Tesla open superconducting magnet has approximately 100,000 cubic centimeters of superconductor. This superconducting magnet has a coil-to-coil gap of approximately 60 cm, which yields a room temperature gap of approximately 50 cm for physician access. It is known that a 55 cm room temperature gap is the minimum acceptable for interventional procedures. Thus, prior MRI system designs do not satisfy the minimal acceptable gap requirement, the minimal stray field requirement, and provide the desired static magnetic field uniformity.

It is infeasible to build a magnet of conventional open magnet design that generates a highly uniform magnetic field and has significantly improved physician access for interventional procedures using the known methods of system design. A superconducting magnet of a conventional design that would satisfy the stated design constraints has approximately 392,000 cubic centimeters of superconductor and a corresponding increase in magnetic forces, which is clearly infeasible to build. Similar infeasibilities exist for cylindrical MRI system designs, especially ones of a "Short"or more compact design.

Thus, there exists a need for an improved MRI system that provides increased magnetic field uniformity, minimizes generation of eddy currents and stray fields, and provides increased MRI system design configuration flexibility.

SUMMARY OF INVENTION

The present invention provides a magnetic resonance imaging (MRI) system that includes a superconducting magnet that generates a static magnetic field. A gradient coil assembly with an associated patient bore enclosure and a gradient coil that generates a gradient magnetic field. A static field-shaping coil resides between the superconducting magnet and the patient bore enclosure and supplements the static magnetic field. This static field-shaping coil may be constructed of a high temperature superconductor or a low temperature superconductor.

The embodiments of the present invention provide several advantages. One advantage provided by an embodiment of the present invention is the provision of a MRI system that incorporates the use of supplemental static field-shaping coils. The field-shaping coils increase strength and uniformity of the static magnetic field while minimizing generation of undesired eddy current heating from the pulsed gradient coils. The field-shaping coils may be unshielded from the pulsed gradient coils, which minimizes design requirements and associated costs thereof.

Another advantage provided by an embodiment of the present invention is the provision of a supplemental static field-shaping coil housing, which further minimizes induction of eddy currents within the MRI system.

Furthermore, the present invention provides multiple superconducting magnet styles, magnet arrangements, and cooling configurations, which increase versatility in design of both cylindrical and open architecture configured MRI systems, as well as other configured MRI systems.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
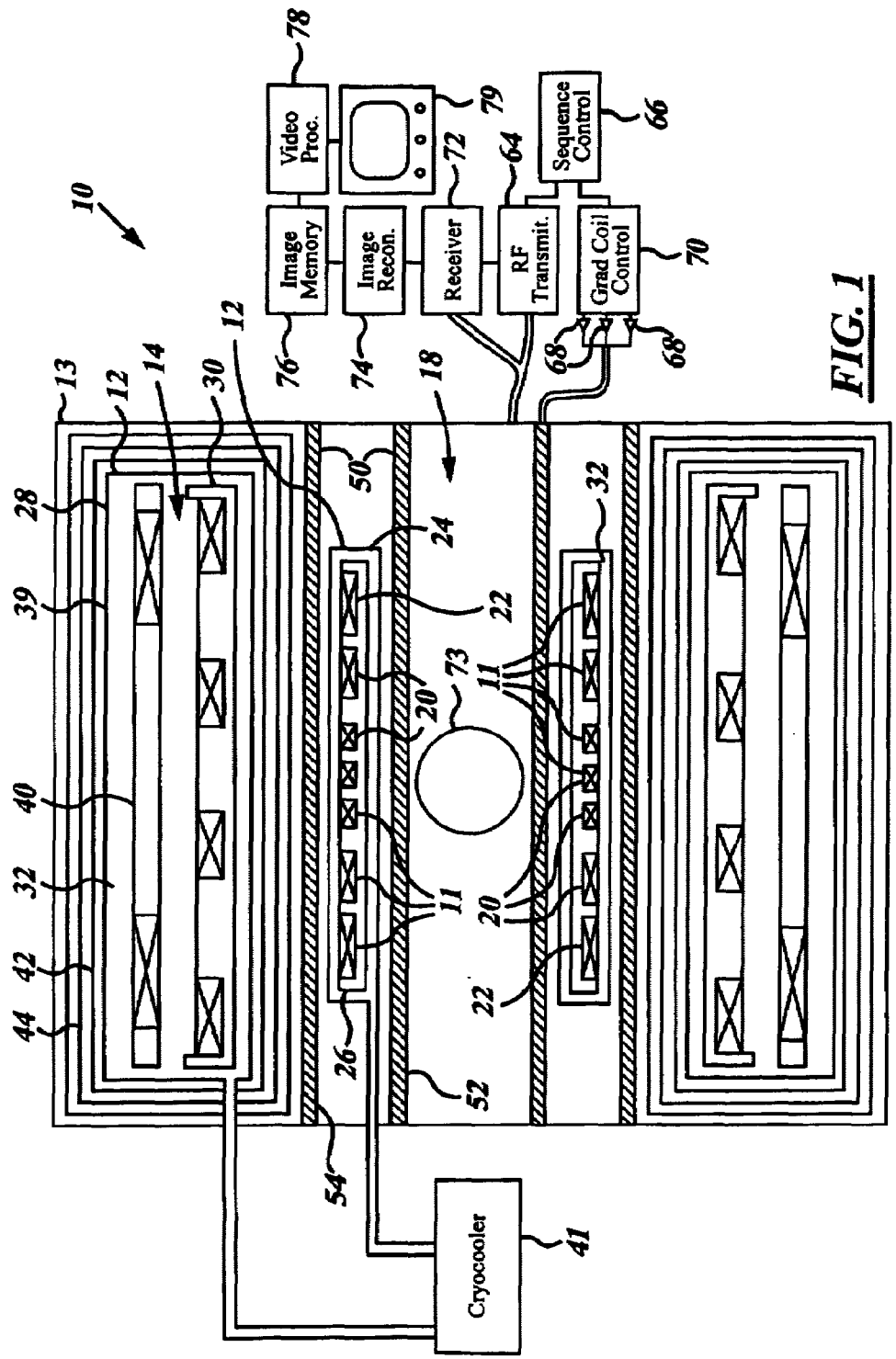
FIG. 1 is a block diagrammatic view of a Magnetic Resonance Imaging (MRI) system incorporating use of supplemental static field-shaping coils and using coolant vessels for cooling in accordance with an embodiment of the present invention.

In each of the following figures, the same reference numerals are used to refer to the same components. While the present invention is described with respect to a system for generating a highly uniform static magnetic field, the present invention may be applied to various systems including: magnetic resonance imaging (MRI) systems, MR spectroscopy systems, and other applications. The present invention may be applied to both cylindrical and open architecture style MRI systems.

In the following description, various operating parameters and components are described for one constructed embodiment. These specific parameters and components are included as examples and are not meant to be limiting.

Referring now to FIG. 1, a block diagammatic view of a MRI system 10 incorporating use of supplemental static field-shaping coils 11 and using coolant vessels 12 for cooling in accordance with an embodiment of the present invention is shown. The MRI system 10 includes a static magnet structure 13 that has a superconducting magnet 14 with a plurality of superconducting magnetic field coils 16. The field-shaping coils 11 and the field coils 16 generate a temporally constant magnetic field along a longitudinal z-axis of a patient bore 18. The field-shaping coils 11 and the superconducting coils 16 may be formed of high temperature or low temperature coils.

Although for simplicity the present invention is primarily described with respect to the cylindrical architecture of the static magnet structure 13, the present invention may be applied to various other MRI system architectures. Current area plots are described below with respect to the embodiments of FIGS. 4 and 6 for the static magnet structure 13, which has a cylindrical structure, and for another static magnet structure (not shown), that has an open architecture.

The field shaping coils 11 include positive coils 20 and negative coils 22. The field-shaping coils 11 are operated in conjunction with and supplement the static field generated by the superconducting magnet 14. The field-shaping coils 11 are approximately a factor of ten smaller and reside closer to the patient bore 18 than the superconducting field coils 16. Due to the smaller size of the field-shaping coils 11 and, as a result, the reduced amount of conductor in the field-shaping coils 11, the gradient coils 52 produce minimal eddy current heating in the field-shaping coils 11. As such, the field-shaping coils 11 may be unshielded from the fluctuating field of the gradient coils 52, as shown. Also, although the current passing through the field-shaping coils 11 is significantly less than the current passing through the superconducting field coils 16, since the field-shaping coils 11 are closer to the patient bore 18 they provide a significant increase in the uniformity of the static magnetic field. Although a specific number of field-shaping coils are shown, any number of field-shaping coils may be utilized. Some of the negative coils 22 may be replaced with iron rings, as desired.

The field-shaping coils 11 reside within a static field-shaping coil housing 24 and are supported by a field-shaping coil former 26. The superconducting magnet coils 16 reside within a cryostat 28 and are supported by a superconducting magnet coil support structure or former 30. The field-shaping coil former 26 and the superconducting magnet former 30 provide support for the static loads and allow fabrication and accurate placement of the field-shaping coils 11 and the main magnet coils 16. Both the housing 24 and the cryostat 28 may be in the form of toroidal helium vessels or in some other form known in the art.

The housing 24 and the cryostat 28 may be cooled and may contain a coolant 32, such as liquid helium, liquid hydrogen, liquid nitrogen, liquid neon, or some other coolant known in the art. The housing 24 may be formed of a non-metallic or composite material to prevent induction therewith and generation of eddy currents. This is described in further detail below. The housing 24 and the cryostat 28 are coupled to a cryocooler 41. The cryocooler 41 maintains the housing 24 and the cryostat 28 at proper operating temperatures. The cryostat 28 includes a main magnetic field shield coil assembly 40. The cryocooler 41 may be isolated and positioned external to the magnet structure 13 to further prevent generation of vibration induced eddy currents.

Figure 2:
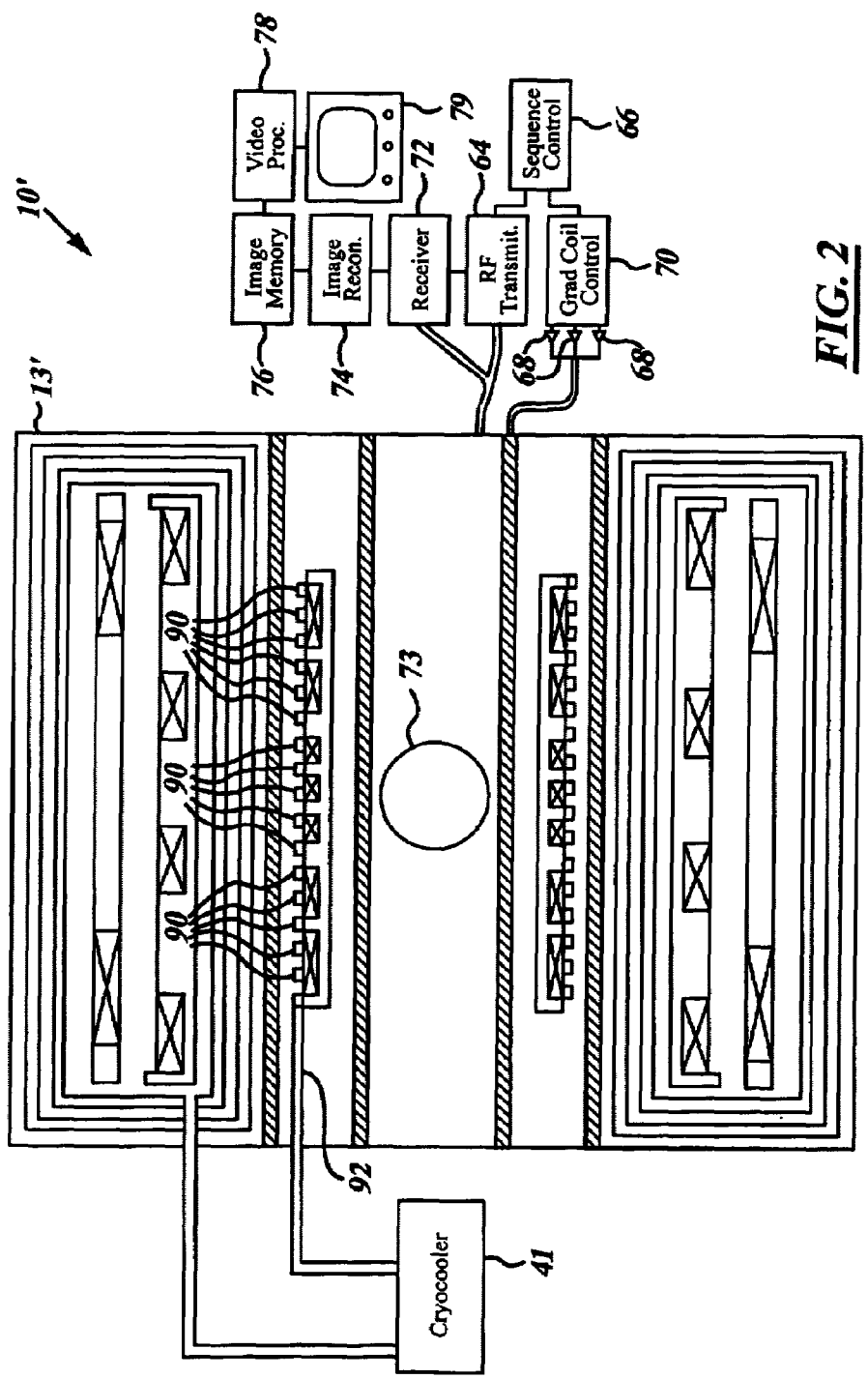
FIG. 2 is a block diagrammatic view of a MRI system incorporating use of supplemental static field-shaping coils and using conduction cooling in accordance with an embodiment of the present invention.

Although the field-shaping coils 11 and the superconducting magnet 14 are shown as being cooled through use of a cryogen bath, they may be cooled through use of conduction or convection, as described with respect to the embodiment of FIG. 2, or may be cooled using other techniques known in the art.

The main magnetic field shield coil assembly 40 generates a magnetic field that opposes the field generated by the superconducting magnet coils 16. A first shield 42 surrounds the cryostat to reduce "boil-off". A second shield 44 may be used to surround the first shield 42. Both the first shield 42 and the second shield 44 may be cooled by mechanical refrigeration.

A magnetic gradient coil assembly 50 resides between the superconducting magnet 14 and the patient bore 18. The gradient coil assembly 50 includes active gradient coils 52, which generate a gradient magnetic field, and gradient shield coils 54, which compensate for the aggressive pulse sequences, which are routinely used in MR imaging. The active gradient coils 52 may reside between the field shaping coils 11 and the patient bore 18. The shield coils 54 reside between the field shaping coils 11 and the superconducting magnet 14.

The patient bore 18 has a RF coil assembly (not shown) mounted therein. The RF coil assembly may include a primary RF coil and a RF shield. A RF transmitter 64 is connected to a sequence controller 66 and the RF coil assembly. The sequence controller 66 controls a series of current pulse generators 68 via a gradient coil controller 70 that is connected to the magnetic gradient coil assembly 50. The RF transmitter 64 in conjunction with the sequence controller 66 generates pulses of radio frequency signals for exciting and manipulating magnetic resonance in selected dipoles of a portion of the subject within the patient bore 18.

A radio frequency receiver 72 is connected with the primary RF coil 62 for demodulating magnetic resonance signals emanating from an examined portion of the subject or the imaging volume 73. An image reconstruction apparatus 74 reconstructs the received magnetic resonance signals into an electronic image representation that is stored in an image memory 76. A video processor 78 converts stored electronic images into an appropriate format for display on a video monitor 79.

Referring now to FIG. 2, a second MRI system 10'' having a static magnet structure 13'' that incorporates use of the field-shaping coils 11 and uses conduction or convection cooling in accordance with an embodiment of the present invention is shown. The field-shaping coils 11, instead of residing within a coolant vessel, are coupled or adjacent to multiple cooling tubes 90. The cooling tubes 90 are coupled to the cryocooler 41. Coolant 92, within the cooling tubes 90, circulates between the former 26 and the cryocooler 41. Thermal energy within the field-shaping coils 11 is transferred to the coolant 92. The cooling tubes 90 may be formed of stainless steel, a composite material, or some other low conductive or eddy current free material.

Figures 3, 4:
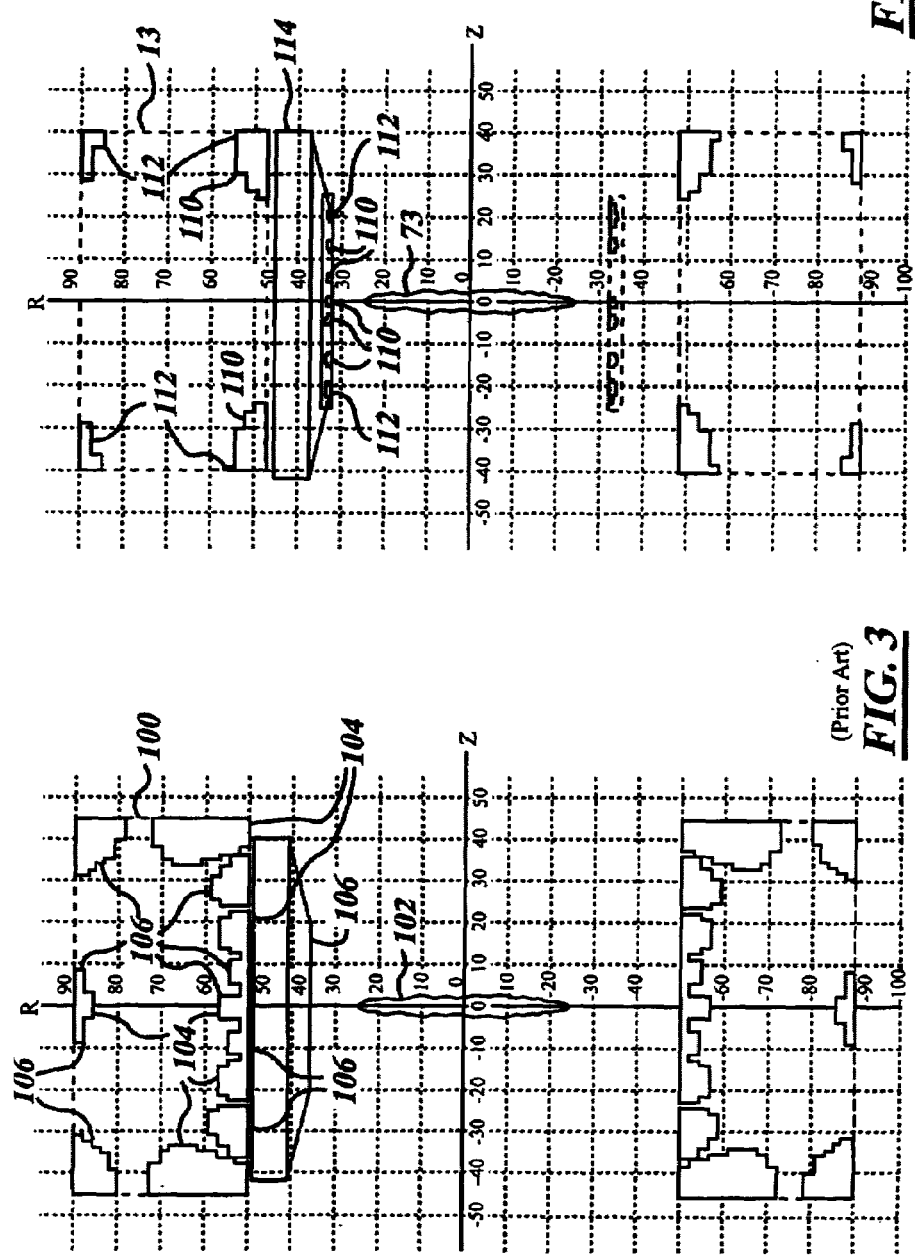
FIG. 3 is a cross-sectional current area plot of a superconducting magnet structure and imaging volume for a typical MRI system having a cylindrical architecture.
FIG. 4 is a cross-sectional current area plot of a superconducting magnet structure and imaging volume for the MRI system of FIG. 1 having a cylindrical architecture in accordance with an embodiment of the present invention.

Referring now to FIG. 3, a cross-sectional current area plot of a superconducting magnet structure 100 and imaging volume 102 for a typical 1.5 Tesla MRI system having a cylindrical architecture is shown. The vertical axis is the radius R in centimeters and the horizontal axis is Z also in centimeters. The size of the superconducting magnet structure 100 is approximately 118,562 cubic centimeters, which provides the desired uniformity of the static magnetic field. The positive areas 104 correspond to positive current areas of the superconducting coils of the superconducting magnet structure 100. The negative areas 106 correspond to negative current areas of the superconducting coils of the superconducting magnet structure 100. The positive areas 104 and the negative areas 106 are directly proportional to electromagnetic forces generated therein. The polygonally shaped shaded area 108 represents the gradient coils. The amount of current passing through the superconducting coils, represented by areas 104 and 106 is undesirable and the size of the superconducting magnet structure 100 is infeasible to manufacture.

Referring now to FIG. 4, a cross-sectional current area plot of the superconducting magnet structure 13 and imaging volume 73 of FIG. 1 in accordance with an embodiment of the present invention is shown. In comparison to the superconducting magnet structure 100, the field-shaping coils 11 and the superconducting field coils 16 of the superconducting magnet structure 13 are significantly smaller. The positive areas 110 correspond to positive current areas of the field-shaping coils 11 and the superconducting coils 16, respectively. The negative areas 112 correspond to the negative current areas of the field-shaping coils 11 and the superconducting coils 16, respectively. The polygonally shaped shaded area 114 represents the gradient coils 52. Notice the reduced size in the positive areas 110 and the negative areas 112 and thus the reduced electromagnetic forces of the superconducting coils 16, as compared to the coils represented by areas 104 and 106. Also, the field-shaping coils 11, represented by areas 110 and 112 are also significantly smaller than the coils, represented by areas 104 and 106.

Figure 5:
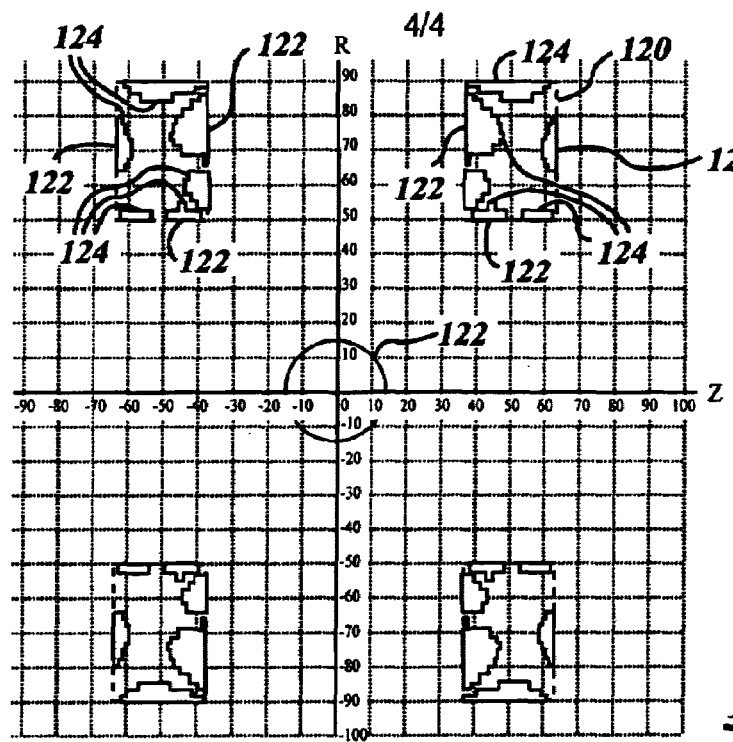
FIG. 5 is a cross-sectional current area plot of a superconducting magnet structure and imaging volume for a simulated MRI system having a typical open architecture design.

Referring now to FIG. 5, a cross-sectional current area plot of a superconducting magnet 120 and imaging volume 122 for a simulated MRI system having a typical open architecture design is shown. The size of the superconducting magnet structure 120 is approximately 392,000 cubic centimeters, which provides the desired uniformity of the static magnetic field and coil-to-coil gap or room temperature gap that is the minimum acceptable for interventional procedures. The positive areas 122 correspond to positive cross-sectional areas of the superconducting coils of the superconducting magnet structure 120. The negative areas 124 correspond to negative current areas of the superconducting coils of the superconducting magnet structure 120. As with the magnet structure 100, the amount of current passing through the superconducting coils, represented by areas 122 and 124, and the size of the superconducting magnet structure 120 is undesirable and infeasible to manufacture.

Figure 6:
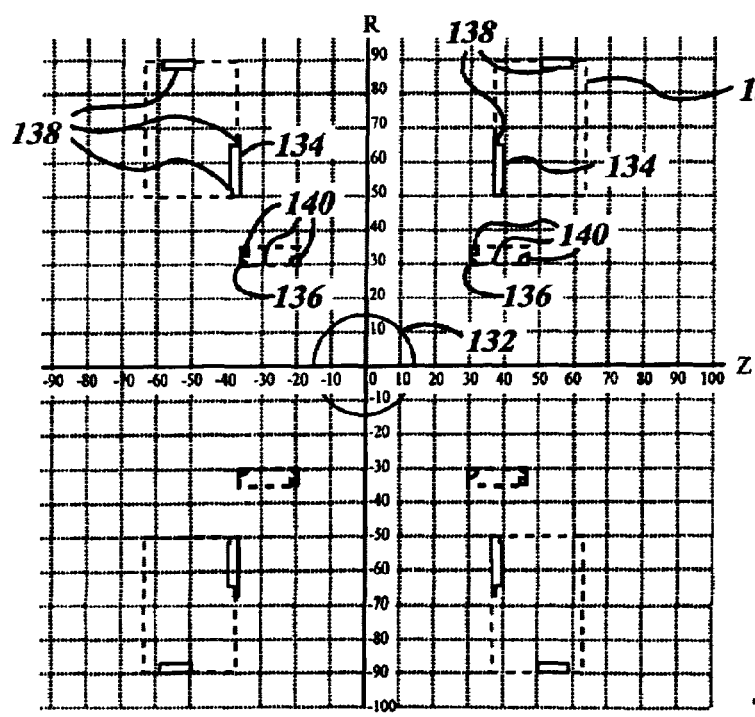
FIG. 6 is a cross-sectional current area plot of a superconducting magnet structure and imaging volume for a MRI system having an open architecture in accordance with an embodiment of the present invention.

Referring now to FIG. 6, a cross-sectional current area plot of a superconducting magnet structure 130 and imaging volume 132 for a MRI system having an open architecture in accordance with an embodiment of the present invention is shown. In comparison to the superconducting magnet structure 120, the superconducting magnet structure 130 utilizes smaller superconducting field coils and in addition utilizes supplemental static field-shaping coils, as described above. The positive areas 134 correspond to positive current areas of the superconducting coils and the positive areas 136 correspond to positive current areas of the field-shaping coils of the superconducting magnet 130. The negative areas 138 correspond to negative current areas of the superconducting coils and the negative areas 140 correspond to negative current areas of the field-shaping coils of the superconducting magnet 130. Notice the reduced size in the positive areas 134 and 136 and the negative areas 138 and 140 and thus the reduced electromagnetic forces. The superconducting coils, represented by areas 134 and 138, are significantly smaller than the coils, represented by areas 122 and 124. Also, the field-shaping coils, represented by areas 136 and 140 are also significantly smaller than the coils, represented by areas 122 and 124.

The present invention therefore provides a MRI system that utilizes supplemental static field-shaping coils, which aid in increasing uniformity of the static magnetic field and minimize stray fields and generation of eddy currents within the MRI system. The present invention also provides multiple cooling techniques for magnets of the MRI system.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A magnetic resonance imaging system comprising:
at least one superconducting magnet generating a static magnetic field;
a gradient coil assembly with an associated patient bore enclosure comprising;

at least one gradient shield coil; and
at least one static field-shaping coil residing between said at least one gradient shield coil and said patient bore enclosure and supplementing said static magnetic field.

2. A system as in claim 1 wherein said at least one superconducting magnet resides within a cryostat having at least one thermal shield, said at least one static field-shaping coil resides between said at least one thermal shield and said patient bore enclosure.

3. A system as in claim 1 wherein said at least one gradient shield coil compensating for pulse sequences generated within the magnetic resonance imaging system.

4. A system as in claim 1 wherein said at least one gradient shield coil resides between said at least one superconducting magnet and said at least one static field-shaping coil.

5. A system as in claim 1 wherein said at least one static field-shaping coil resides between said at least one gradient shield coil and at least one gradient coil.

6. A system as in claim 1 wherein said gradient coil assembly comprises said at least one gradient shield coil.

7. A system as in claim 1 further comprising a static field-shaping coil housing residing within a magnet structure of the magnetic resonance imaging system, said at least one static field-shaping coil residing within said static field-shaping coil housing.

8. A system as in claim 7 wherein said static field-shaping coil housing is formed of a material that prevents induction of eddy currents therein.

9. A system as in claim 7 wherein said static field-shaping coil housing is formed of a composite material.

10. A system as in claim 7 wherein said static field-shaping coil housing comprises a coolant.

11. A system as in claim 10 wherein said coolant is cooled via a cryocooler.

12. A system as in claim 1 wherein the magnetic resonance imaging system is of a cylindrical or open architecture design.

13. A system as in claim 1 wherein said at least one superconducting magnet comprises at least one low temperature superconductor.

14. A system as in claim 1 wherein said at least one superconducting magnet comprises at least one high temperature superconductor.

15. A system as in claim 1 wherein said at least one static field-shaping coil comprises at least one low temperature superconductor.

16. A system as in claim 1 wherein said at least one static field-shaping coil comprises at least one high temperature superconductor.

17. A system as in claim 1 wherein said at least one static field-shaping coil is unshielded from said at least one gradient magnetic field.

18. A system as in claim 1 wherein said at least one static field-shaping coil is inductively isolated from said at least one gradient coil assembly.

19. A system as in claim 1 wherein said at least one static field-shaping coil is cooled using at least one of a cryogen bath, conduction, or convection.

20. A system as in claim 1 wherein said at least one static field-shaping coil is cooled via a coolant selected from at least one of helium, nitrogen, hydrogen or neon.

21. A system as in claim 1 wherein said at least one static field-shaping coil is approximately a factor of ten smaller than said at least one superconducting magnet.

22. A system as in claim 1 wherein at least one of said at least one static field-shaping coil is replaced with an iron ring.

23. A system as in claim 1 wherein said at least one superconducting magnet resides at least partially within a first former and said at least one static field-shaping coil resides at least partially within a second former.

24. A magnetic resonance imaging system comprising:
at least one superconducting magnet generating a static magnetic field;
a gradient coil assembly with an associated patient bore enclosure comprising;
at least one gradient coil generating at least one gradient magnetic field; and
at least one static field-shaping coil residing within said gradient coil assembly and increasing strength of said static magnetic field.

25. A system as in claim 24 further comprising at least one gradient shield coil residing between said at least one superconducting magnet and said patient bore enclosure.

26. A magnetic resonance imaging system comprising:
at least one superconducting magnet generating a static magnetic field;
at least one gradient shield coil compensating for pulse sequences generated within the magnetic resonance imaging system;
a gradient coil assembly with an associated patient bore enclosure comprising;
at least one gradient coil generating at least one gradient magnetic field in the patient bore; and
at least one supplemental static field-shaping coil residing between said at least one gradient shield coil and said patient bore enclosure, said at least one supplemental static field-shaping coil being unshielded from said at least one gradient magnetic field and increasing strength of said static magnetic field.

27. A system as in claim 26 wherein said at least one supplemental static field-shaping coil resides external to said at least one gradient coil.

* * * * *